US 8,053,779 B2

(12) United States Patent
Jun et al.

(10) Patent No.: US 8,053,779 B2
(45) Date of Patent: Nov. 8, 2011

(54) THIN FILM TRANSISTOR PANEL, METHOD OF FABRICATING THE SAME, AND ORGANIC LIGHT EMITTING DISPLAY DEVICE INCLUDING THE SAME

(75) Inventors: Woo-Sik Jun, Suwon-si (KR);
Kyung-Jin Yoo, Suwon-si (KR);
Choong-Youl Im, Suwon-si (KR);
Jong-Hyun Choi, Suwon-si (KR);
Do-Hyun Kwon, Suwon-si (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 1149 days.

(21) Appl. No.: 11/783,097

(22) Filed: Apr. 5, 2007

(65) Prior Publication Data
US 2007/0238227 A1 Oct. 11, 2007

(30) Foreign Application Priority Data
Apr. 5, 2006 (KR) .................. 10-2006-0031134

(51) Int. Cl.
*H01L 29/12* (2006.01)

(52) U.S. Cl. ............... 257/71; 257/67; 257/68; 257/69; 257/202; 257/204; 438/151; 438/155; 438/164; 438/405; 438/455

(58) Field of Classification Search .......... 438/149, 438/151, 154, 155, 158, 164, FOR. 184, FOR. 201, 438/405, 455, 459, 974; 257/66, 67, 68, 257/69, 71, 202, 204, E27.059, E27.108, 257/E51.005, E29.151, E27.1, E27.117, E29.137, 257/E29.134, E21.411; 148/DIG. 12
See application file for complete search history.

(56) References Cited

U.S. PATENT DOCUMENTS
2002/0104995 A1* 8/2002 Yamazaki et al. .............. 257/72
(Continued)

FOREIGN PATENT DOCUMENTS
KR 2003-0013047 2/2003
(Continued)

OTHER PUBLICATIONS
*The Decision of Grant* from the Korean Intellectual Property Office issued in Applicant's corresponding Korean Patent Application N. 2006-31134 dated Sep. 6, 2007.
(Continued)

*Primary Examiner* — N Drew Richards
*Assistant Examiner* — Joannie A Garcia
(74) *Attorney, Agent, or Firm* — Robert E. Bushnell, Esq.

(57) ABSTRACT

Provided are a thin film transistor (TFT) panel, a method of fabricating the same, and an organic light emitting display device (OLED) including the same. The TFT panel has a TFT region and a capacitor region. A TFT is formed in the TFT region and a capacitor is formed in the capacitor region. The TFT includes an active layer that includes a source and a drain regions. A gate insulation layer is formed on the active layer, and a gate electrode is formed on the gate insulation layer over the active layer. A source and a drain electrodes are formed over the active layer, and connected to the source and drain regions, respectively. In the TFT region, an interlayer insulation layer is formed between the gate electrode and the source/drain electrodes. In the capacitor region, an interlayer insulation layer is formed between a capacitor lower electrode and a capacitor upper electrode to form a capacitor. The interlayer insulation layers of the TFT region and the capacitor region have different layer structures and have different dielectric constants. Therefore, the capacitor region can have higher capacitance while the TFT region can have lower capacitance to reduce parasitic capacitance.

21 Claims, 11 Drawing Sheets

U.S. PATENT DOCUMENTS

| | | | |
|---|---|---|---|
| 2004/0108543 A1* | 6/2004 | Yamazaki et al. | 257/316 |
| 2005/0269946 A1* | 12/2005 | Jeong et al. | 313/504 |
| 2005/0285197 A1* | 12/2005 | Park | 257/347 |
| 2006/0022587 A1* | 2/2006 | Jeong et al. | 313/504 |

FOREIGN PATENT DOCUMENTS

| | | |
|---|---|---|
| KR | 10-2004-0059362 | 7/2004 |
| KR | 10-2004-0086120 | 10/2004 |
| KR | 10-2005-0053682 | 6/2005 |
| KR | 10-2006-0003632 | 1/2006 |
| KR | 10-2006-0114538 | 11/2006 |

OTHER PUBLICATIONS

Korean Office Action, issued by the Korean Intellectual Property Office on Mar. 27, 2007, in Applicant's corresponding Korean patent application No. 10-2006-0031134.

* cited by examiner

THIN FILM TRANSISTOR PANEL, METHOD OF FABRICATING THE SAME, AND ORGANIC LIGHT EMITTING DISPLAY DEVICE INCLUDING THE SAME

CLAIM OF PRIORITY

This application makes reference to, incorporates the same herein, and claims all benefits accruing under 35 U.S.C. §119 from an application for TFT PANEL AND METHOD OF FABRICATING THE SAME AND ORGANIC LIGHT EMITTING DEVICE WITH THE SAME earlier filed in the Korean Intellectual Property Office on the 5 of Apr. 2006 and there duly assigned Serial No. 10-2006-0031134.

BACKGROUND OF THE INVENTION

1. Field of the Invention

The present invention relates to a thin film transistor (TFT) panel, a method of fabricating the same, and an organic light emitting display device (OLED) including the same. More particularly, the present invention relates to a TFT panel having interlayer insulation layers with different dielectric constants in a TFT region and a capacitor region, a method of fabricating the same, and an OLED including the same.

2. Description of the Related Art

In general, an organic light emitting display device (OLED), which is one of flat panel displays, is an emission type display device capable of injecting electrons and holes into an emission layer from an electron injection electrode (cathode) and a hole injection electrode (anode), respectively, to emit light when an exciton, in which the injected electrons are combined with the injected holes, transitions from an excited state to a ground state.

Therefore, unlike liquid crystal displays, there is no need to install a separate light source in the OLED, and it is possible to reduce volume and weight of the display. The OLED can be classified into a passive matrix OLED and an active matrix OLED according to driving mechanism. An active matrix OLED has an active driving element such as a thin film transistor, (TFT), while a passive matrix OLED does not have the active driving element.

While a method of fabricating the passive matrix OLED is simple because of its simple structure, the passive matrix OLED has problems of high power consumption, and has difficulties in realizing a display having a large size screen. In addition, the passive matrix OLED has more interconnections, and therefore reduces the aperture ratio. As a result, the passive matrix OLED is mostly used for small size or lower resolution displays, and an active matrix OLED is used for large size or high resolution displays.

In the case of an active matrix OLED having a TFT panel to drive an organic light emitting diode, the TFT panel includes a TFT and a capacitor. In order to increase the capacitance of the capacitor of the TFT panel, technology to use a high dielectric material for an interlayer insulation layer of the TFT panel has been developed. The high dielectric material, however, increases a parasitic capacitance in the TFT of the TFT panel, and the increased parasitic capacitance of the TFT element degrades the characteristics of the TFT panel, accordingly degrades the quality of the active matrix OLED. Therefore, new technology is necessary to reduce the parasitic capacitance of the TFT of the TFT panel, while maintaining the high capacitance of the capacitor of the TFT panel.

SUMMARY OF THE INVENTION

The present invention provides a TFT panel, a method of fabricating the same, and an organic light emitting display device (OLED) including the same, which is capable of forming different interlayer insulating layers, which have different dielectric constants, in a TFT region and a capacitor region of the TFT panel.

The present invention also provides a TFT panel, a method of fabricating the same, and an OLED including the same, which is capable of increasing the capacitance of a capacitor by employing an interlayer insulating layer with a high dielectric constant in a capacitor region of the TFT panel.

According to an aspect of the present invention, a thin film transistor panel includes a substrate having a TFT region and a capacitor region on a surface of the substrate, an active layer formed on the TFT region of the substrate where the active layer includes a source region and a drain region, a gate insulation layer formed on the TFT region and formed on the capacitor region of the substrate, a gate electrode formed on the gate insulation layer over the active layer, a TFT interlayer insulation layer formed in the TFT region where the TFT interlayer insulation layer is formed on the gate electrode and on a region of the gate insulation layer on which the gate electrode is not formed, a source electrode formed on the TFT interlayer insulation layer where the source electrode is connected to the source region, a drain electrode formed on the TFT interlayer insulation layer where the drain electrode is connected to the drain region, a capacitor lower electrode formed on the gate insulation layer of the capacitor region, a capacitor interlayer insulation layer formed on the capacitor lower electrode where the capacitor interlayer insulation layer has a different dielectric constant from the TFT interlayer insulation layer, and a capacitor upper electrode formed on the capacitor interlayer insulation layer.

The capacitor interlayer insulation layer may have a higher dielectric constant than the TFT interlayer insulation layer.

The capacitor interlayer insulation layer may include a first capacitor insulation layer pattern formed on the capacitor lower electrode, and a second capacitor insulation layer formed on the first capacitor insulation layer pattern.

The TFT interlayer insulating layer may include a first TFT insulation layer pattern formed on a region of the gate insulation layer on which the gate electrode is not formed, and a second TFT insulation layer formed on the first TFT insulation layer and formed on the gate electrode. The first TFT insulation layer pattern may be made of the same material as the first capacitor insulation layer pattern, and the second TFT insulation layer may be made of the same material as the second capacitor insulation layer.

The first capacitor insulation layer may have a higher dielectric constant than the second capacitor insulation layer. The first capacitor insulation layer may be made of a material such as tantalum pentoxide ($Ta_2O_5$), titanium dioxide ($TiO_2$), silicon nitride (SiNx), or aluminum oxide ($Al_2O_3$). The second capacitor insulation layer may be made of a material such as silicon oxide ($SiO_2$), silicon nitride (SiNx), or silicon oxynitride (SiON).

The thin film transistor panel may further includes a passivation layer formed on the source electrode, on the drain electrode, and on the capacitor upper electrode.

According to another aspect of the present invention, a method of fabricating a thin film transistor panel includes steps of preparing a substrate having a TFT region and a capacitor region on a surface of the substrate, forming an active layer on the TFT region of the substrate where the active layer includes a source region and a drain region, forming a gate insulating layer on the TFT region and on the capacitor region of the substrate, forming a gate electrode on the gate insulation layer over the active layer, forming a capacitor lower electrode on the gate insulation layer of the capacitor region, forming a TFT interlayer insulation layer on the gate electrode and on a region of the gate insulation layer on which the gate electrode is not formed where the TFT interlayer insulation layer is formed in the TFT region, forming a capacitor interlayer insulation layer on the capacitor lower electrode where the capacitor interlayer insulation layer has a different dielectric constant from the TFT interlayer insulation layer, forming a source electrode on the TFT interlayer insulation layer where the source electrode is connected to the source region, forming a drain electrode on the TFT interlayer insulation layer where the drain electrode is connected to the drain region, and forming a capacitor upper electrode formed on the capacitor interlayer insulation layer.

The capacitor interlayer insulation layer may have a higher dielectric constant than the TFT interlayer insulation layer.

The step of forming the capacitor interlayer insulation layer may include steps of forming a first capacitor insulation layer pattern on the capacitor lower electrode, and forming a second capacitor insulation layer on the first capacitor insulation layer pattern.

The step of forming the TFT interlayer insulation layer may include steps of forming a first TFT insulation layer pattern on a region of the gate insulation layer on which the gate electrode is not formed, and forming a second TFT insulation layer on the first capacitor insulation layer and formed on the gate electrode. The first capacitor insulation layer having a higher dielectric constant than the second capacitor insulation layer.

The method of fabricating a thin film transistor panel may further include a step of forming a passivation layer on the source electrode, on the drain electrode, and on the capacitor upper electrode.

According to still another aspect of the present invention, an OLED includes a substrate having a TFT region and a capacitor region on a surface of the substrate, an active layer formed on the TFT region of the substrate where the active layer includes a source region and a drain region, a gate insulation layer formed on the active layer and formed on the capacitor region of the substrate, a gate electrode formed on the gate insulation layer over the active layer, a TFT interlayer insulation layer formed in the TFT region where the TFT interlayer insulation layer is formed on the gate electrode and on a region of the gate insulation layer on which the gate electrode is not formed, a source electrode formed on the TFT interlayer insulation layer where the source electrode is connected to the source region, a drain electrode formed on the TFT interlayer insulation layer where the drain electrode is connected to the drain region, a capacitor lower electrode formed on the gate insulation layer of the capacitor region, a capacitor interlayer insulation layer formed on the capacitor lower electrode where the capacitor interlayer insulation layer has a different dielectric constant from the TFT interlayer insulation layer, a capacitor upper electrode formed on the capacitor interlayer insulation layer, a passivation layer formed on the source electrode, on the drain electrode, and on the capacitor upper electrode, and an organic light emitting diode having a first electrode, an organic layer, and a second electrode where the first electrode of the organic light emitting diode is connected to the source electrode or the drain electrode.

BRIEF DESCRIPTION OF THE DRAWINGS

A more complete appreciation of the invention and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

The present invention will now be described more completely hereinafter with reference to the accompanying drawings, in which exemplary embodiments of the invention are shown.

Figure 1:
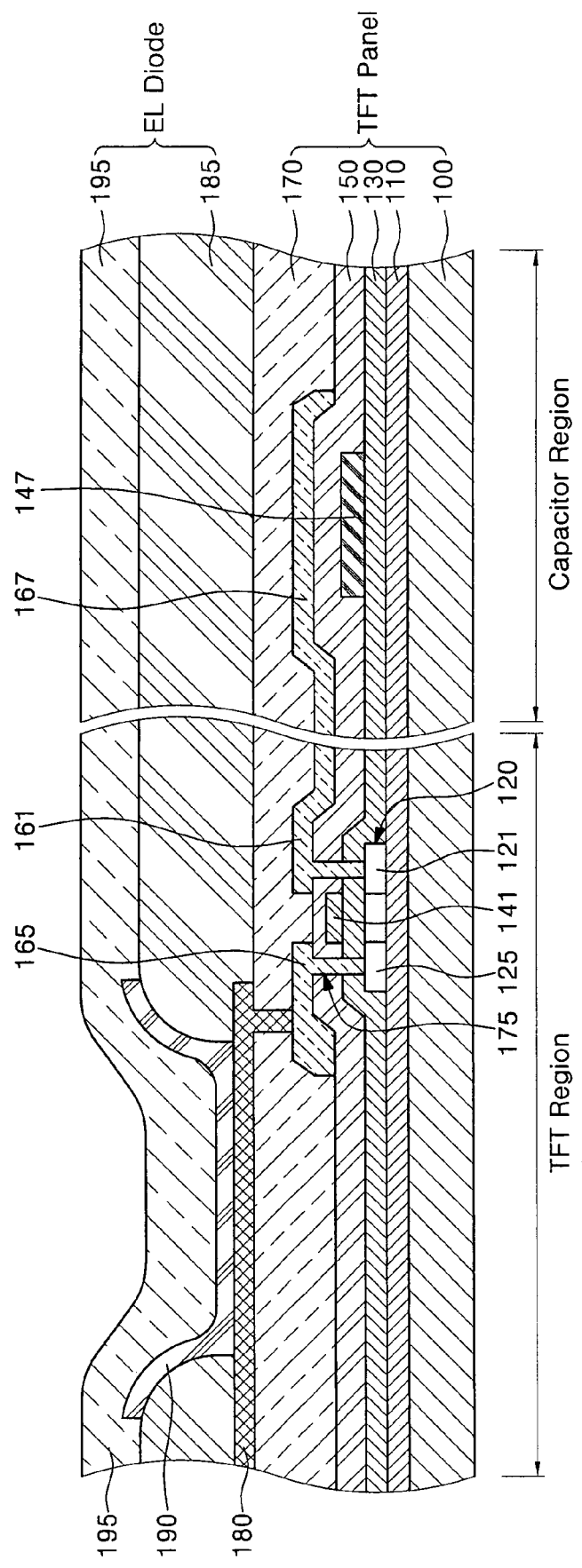
FIG. 1 is a cross-sectional view of an organic light emitting display device (OLED)

FIG. 1 is a cross-sectional view showing an organic light emitting display device (OLED), illustrating a thin film transistor (TFT), a pixel electrode and a capacitor. Referring to FIG. 1, the OLED includes a TFT panel having a TFT and a capacitor, and an organic light emitting diode connected to the TFT panel. The structure of the OLED will now be described with reference to FIG. 1.

An OLED has substrate 100 that has a TFT region and a capacitor region. Herein, the TFT region is also referred to as a TFT region. A TFT is formed in the TFT region, and a capacitor is formed in the capacitor region. Buffer layer 110 formed on substrate 100. Active layer 120 having source region 121 and drain region 125 is formed on buffer layer 110. Gate electrode 141 and capacitor lower electrode 147 of a capacitor are formed on gate insulation layer 130 in a TFT region and in a capacitor region, respectively. Source and drain electrodes 161 and 165 are connected to source and drain regions 121 and 125, respectively, through contact holes, thereby forming a TFT. Capacitor upper electrode 167 of the capacitor are formed on interlayer insulation layer 150, thereby forming a capacitor. Passivation layer 170 is formed on the top surface of substrate 100 covering capacitor upper electrode 167, source electrode 161, and drain electrode 165, to form a TFT panel.

First electrode 180, which is a pixel electrode and works as an anode electrode of the organic light emitting diode, is formed in passivation layer 170. First electrode 180 is connected to source electrode 161 or drain electrode 165 through via hole 175. Pixel defining layer 185, having an opening that exposes a portion of first electrode 180, is formed, and organic layer 190 is formed on first electrode 180 exposed through the opening. Second electrode 195, which works as a cathode electrode, is formed on organic layer 190 and on pixel defining layer 185, thereby forming an organic light emitting diode that is electrically connected to the TFT of the TFT panel.

FIGS. 2A to 2F show cross-sectional views of processes of fabricating an organic light emitting display device (OLED) constructed as an exemplary embodiment of the present invention, which includes a capacitor, a TFT, and an organic light emitting diode connected to the TFT. The OLED of the present invention includes a TFT region and a capacitor region. A TFT is formed in the TFT region, and a capacitor is formed in the capacitor region. The OLED of the present invention, however, has interlayer insulation layers that have different dielectric constants and formed in the TFT region and in the capacitor region, respectively.

Hereinafter, manufacturing processes in accordance with an exemplary embodiment of the present invention will be described with reference to the accompanying drawings.

Figure 2A:
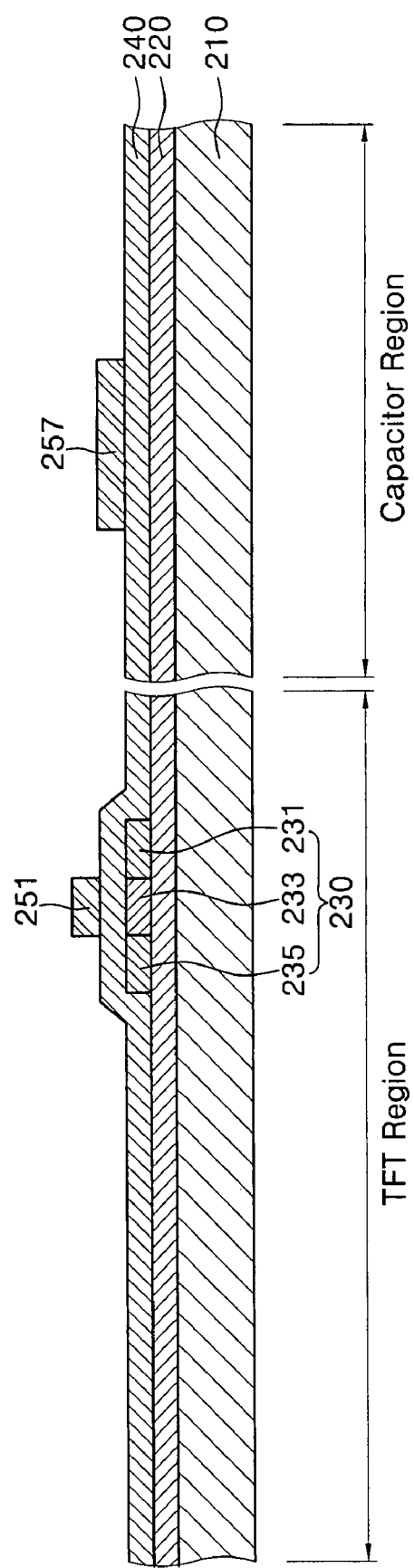
FIGS. 2A to 2F show cross-sectional views at processes of fabricating an OLED constructed as an exemplary embodiment of the present invention.

Referring to FIG. 2A, substrate 210 has a TFT region (or a transistor region) and a capacitor region on a surface of substrate 210. Buffer layer 220 is formed on substrate 210. Active layer 230 having source region 231 and drain region 235 is formed on substrate 210 in the TFT region. A region 233, which is formed between source region 231 and drain region 235, works as a channel region of a TFT.

After forming active layer 230, gate insulating layer 240 is formed on substrate 210. Then, gate electrode 251 is formed on gate insulation layer 240 over active layer 230 in the TFT region. Gate electrode 251 is formed by applying a predetermined conductive material and by patterning the conductive material layer. Capacitor lower electrode 257 of a capacitor is formed on gate insulation layer 240 in the capacitor region.

Figure 2B:
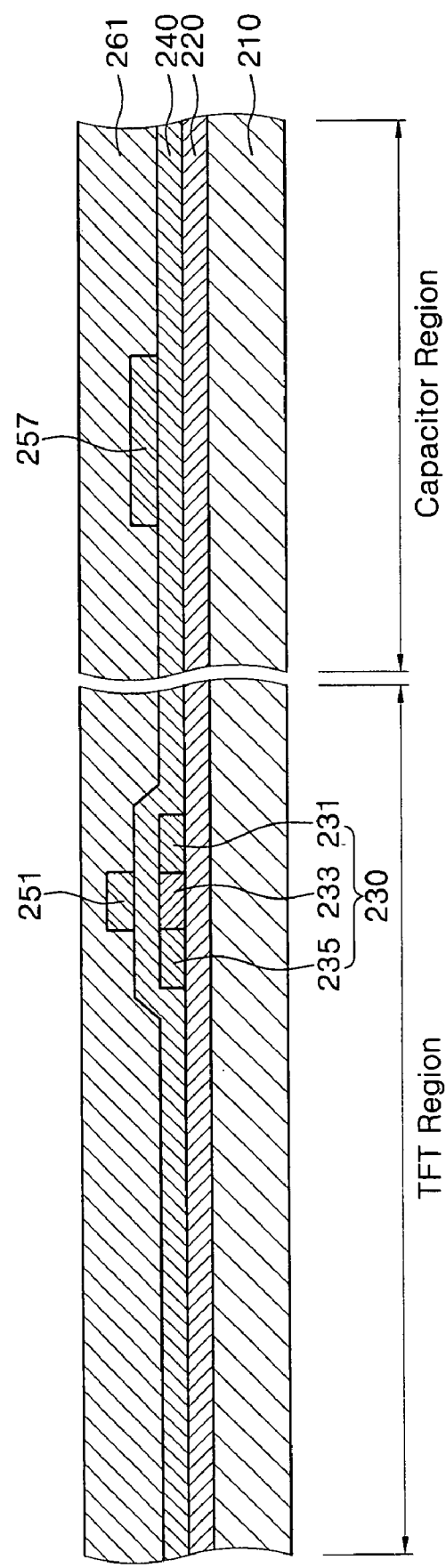

Referring to FIG. 2B, after forming gate electrode 251 and capacitor lower electrode 257 of the capacitor, a first insulating layer 261 made of a high dielectric material is deposited on the entire surface of substrate 210. The high dielectric material can be tantalum pentoxide ($Ta_2O_5$), titanium dioxide ($TiO_2$), silicon nitride (SiNx), or aluminum oxide ($Al_2O_3$).

Figure 2C:
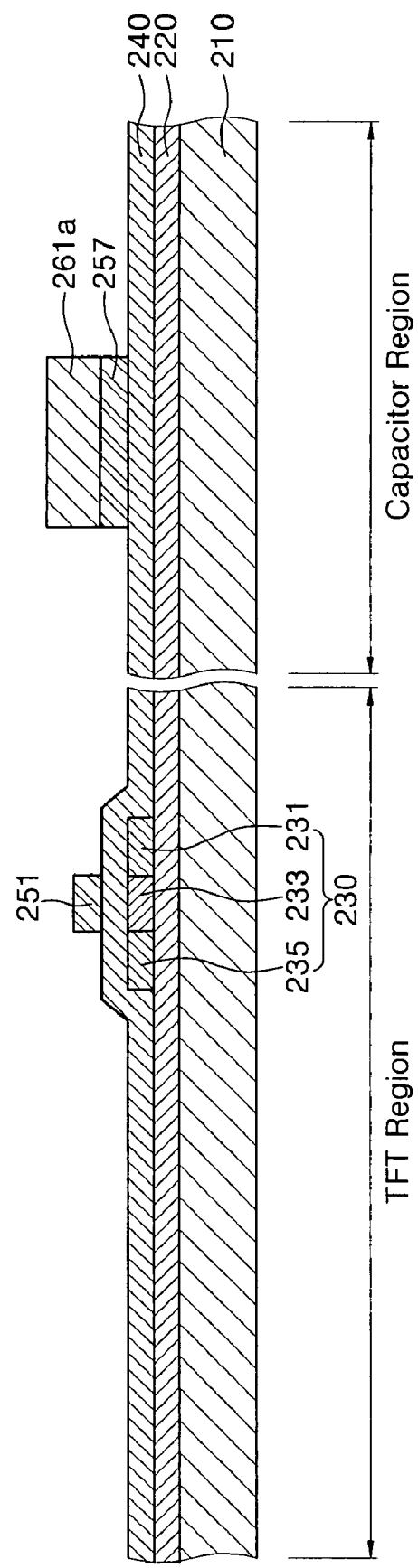

Referring to FIG. 2C, after forming first insulation layer 261, first insulation layer 261 is patterned to form first insulation layer pattern 261a, which exists only on the top of capacitor lower electrode 257 in the capacitor region. In other words, first insulation layer 261 in an unnecessary area is removed to make first insulation layer pattern 261a, which works as a dielectric layer of the capacitor that will be formed in the capacitor region.

Figure 2D:
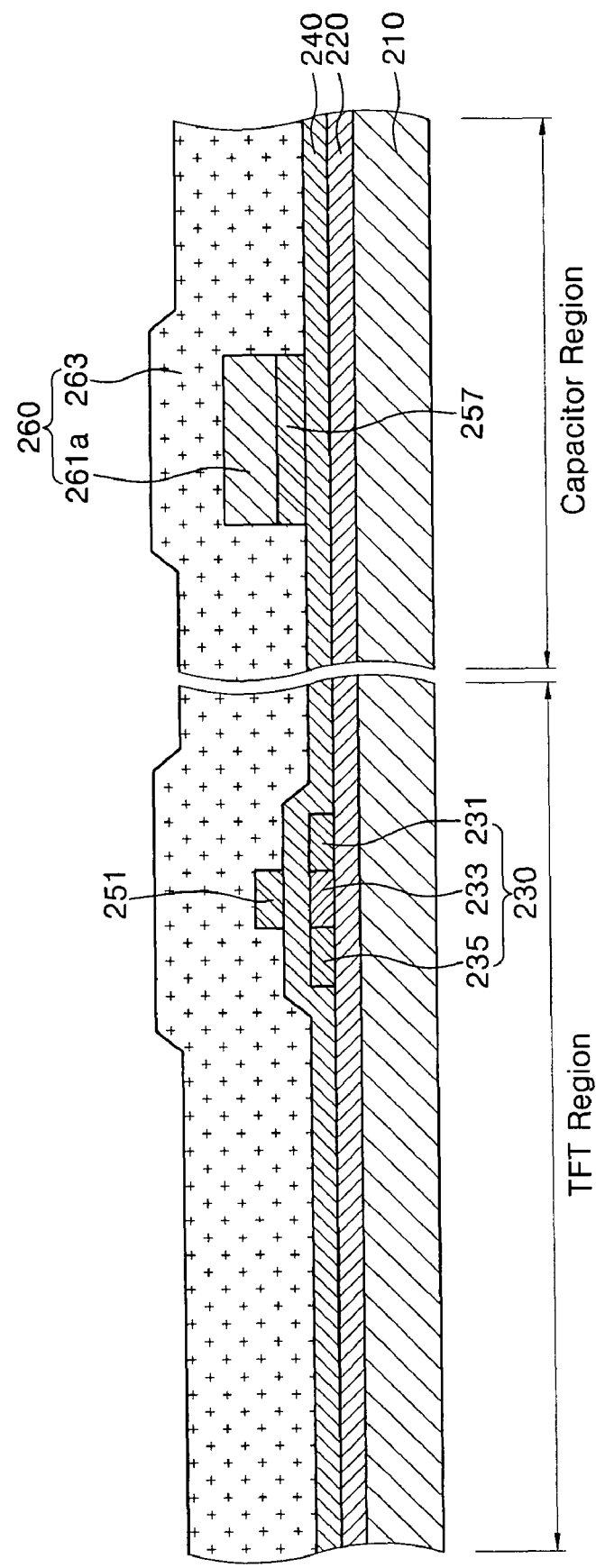
Figure 2E:
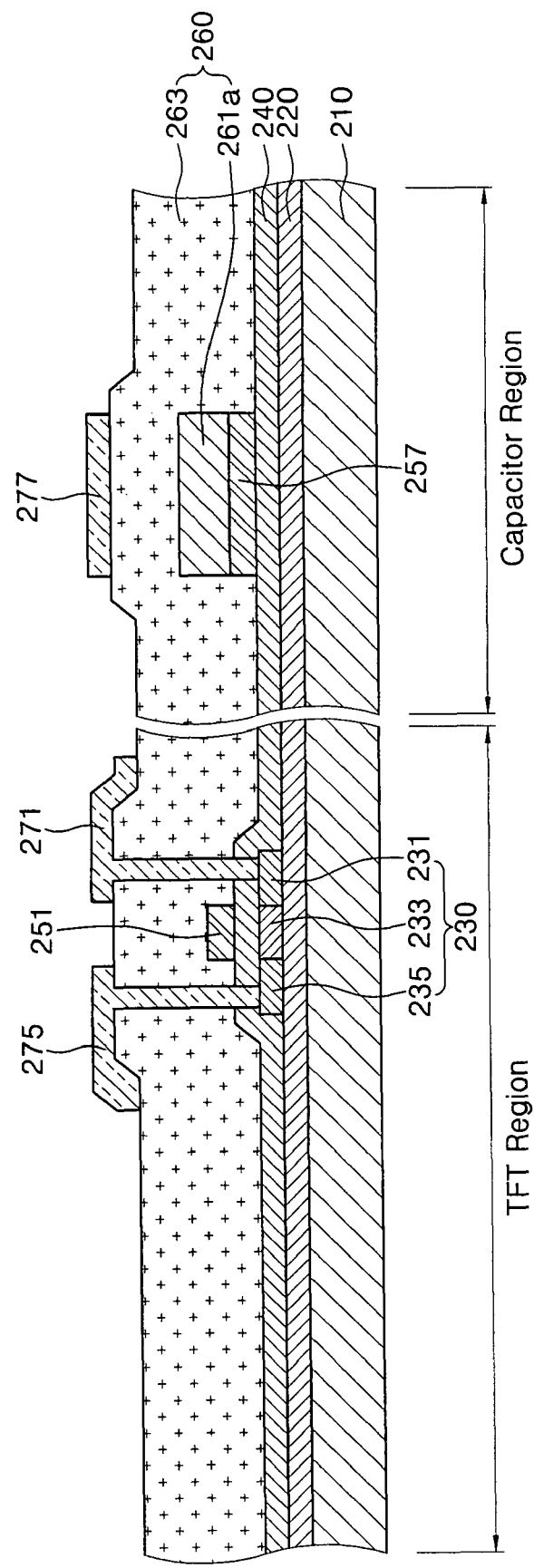

Referring to FIG. 2D, after forming first insulation layer pattern 261a, second insulation layer 263 is formed on the entire surface of substrate 210 to form interlayer insulation layer 260 that includes first insulation layer pattern 261a and second insulation layer 263. Second insulation layer 263 may be formed of silicon oxide ($SiO_2$), silicon nitride (SiNx), silicon oxynitride (SiON), or equivalents thereof, which is generally used to form an insulation layer. Second insulation layer 263 may be formed of a material having a relatively low dielectric constant in comparison with first insulation layer 261.

As shown in FIG. 2D, interlayer insulation layer 260 formed in the capacitor region has first insulation layer pattern 261a and second insulation layer 263, while interlayer insulation layer 260 formed in the TFT region has only second insulation layer 263. Therefore, the interlayer insulation layer of the capacitor region can be referred to as a capacitor interlayer insulation layer, and the interlayer insulation layer of the TFT region can be referred to as a TFT interlayer insulation layer. Moreover, first insulation layer pattern 261a formed on capacitor lower electrode 257 can be referred to as a first capacitor insulation layer pattern, as first insulation layer pattern 261a is formed in the capacitor region in this embodiment. Second insulation layer 263 formed on the first capacitor insulation layer pattern can be referred to as a second capacitor insulation layer.

Referring to 2E, after forming interlayer insulation layer 260 including second insulation layer 263, contact hole 267 (shown in FIG. 2F) is formed through interlayer insulation layer 260. Portions of source and drain regions 231 and 235 of active layer 230 are exposed through contact hole 267.

After forming contact hole 267, a predetermined conductive material is deposited and patterned to form source and drain electrodes 271 and 275, which are electrically connected to source and drain regions 231 and 235, respectively, through contact hole 267. Capacitor upper electrode 277 is formed in the capacitor region to construct a capacitor together with capacitor lower electrode 257 and interlayer insulation layer 260 in the capacitor region.

Figure 2F:
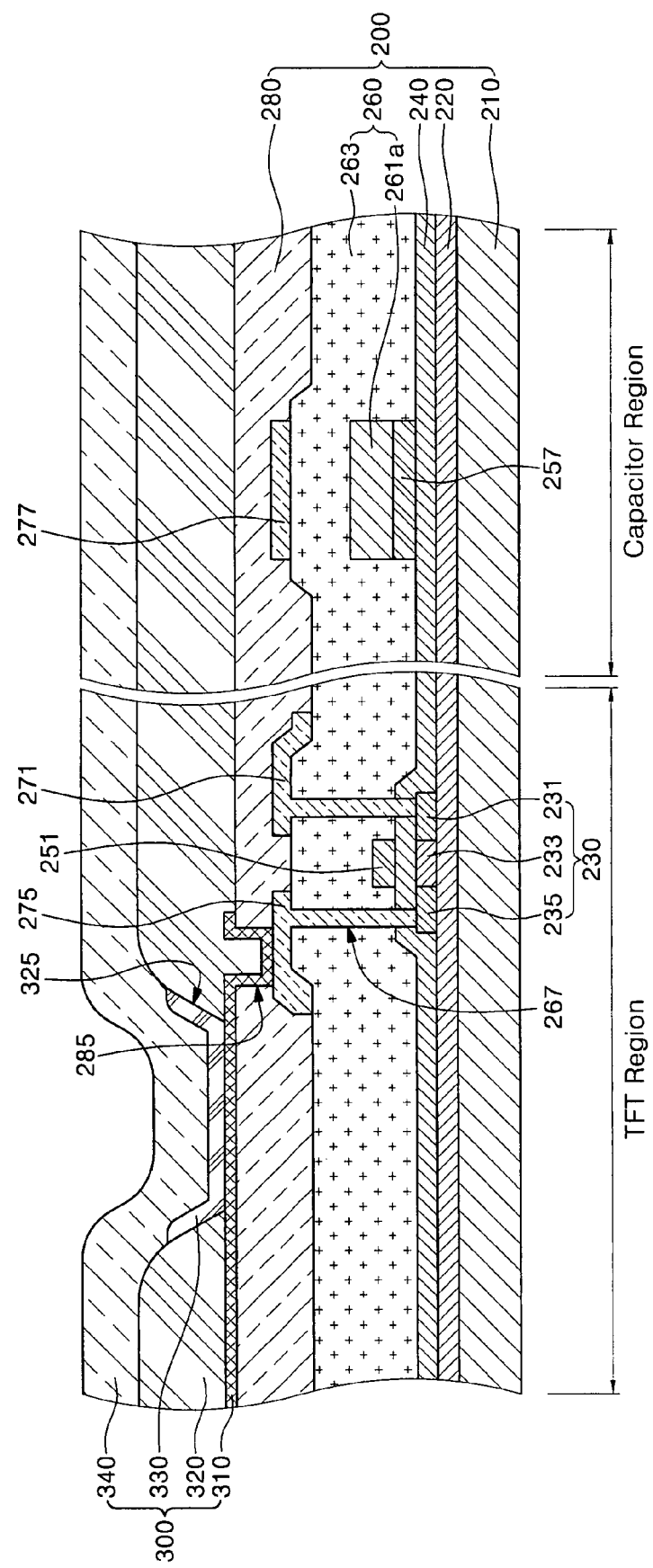

Referring to FIG. 2F, passivation layer 280 is formed on the entire surface of the substrate 210 covering source electrode 172, drain electrode 275, and capacitor upper electrode 277 to form TFT panel 200. Passivation layer 280 is patterned to make via-hole 285 that exposes a portion of source electrode 271 or drain electrode 275. In this embodiment, drain electrode 275 is exposed through via-hole 285.

Organic light emitting diode 300, which is electrically connected to source electrode 271 or drain electrode 275, is formed on the top of passivation layer 280. Specifically describing the processes of fabricating organic light emitting diode 300, a conductive layer, which can include a transparent conductive layer made of a material such as indium tin oxide (ITO), is deposited and patterned to form a first electrode 310 of organic light emitting diode 300. First electrode 310 works as a pixel electrode that is electrically connected to source electrode 271 or drain electrode 275. In this embodiment, first electrode 310 is connected to drain electrode 275 through via-hole 285.

After forming first electrode 310, pixel defining layer 320 is formed on the top of substrate 210 covering passivation layer 280 and first electrode 310. Pixel defining layer 320 has opening 325, through which a portion of first electrode 310 is exposed. Organic layer 330 is formed in opening 325 to cover an upper part of first electrode 310 that is exposed through opening 325.

Organic layer 330 may include various layers depending on its function. Organic layer 330 may include an emission layer, and may further include a layer such as a hole injection layer (HIL), a hole transport layer (HTL), an emission layer, a hole blocking layer (HBL), an electron transport layer (ETL), an electron injection layer (EIL), or combinations thereof.

In an exemplary embodiment of the present invention, which is not illustrated, organic layer 330 can include a hole injection layer (HIL) and a hole transport layer (HTL) that are formed on the entire surface of the substrate, an emission layer that is formed in the opening, and a hole blocking layer (HBL), an electron transport layer (ETL), and an electron injection layer (EIL), which are formed on the entire surface of the substrate.

After forming organic layer 330, second electrode 340 is formed on the entire surface of the substrate 210 to complete organic light emitting diode 300. Then, processes, such as an encapsulation process and so on, are performed to complete an OLED that is constructed as an exemplary embodiment of the present invention.

FIGS. 3A to 3D show cross-sectional views of processes of fabricating an OLED constructed as another exemplary embodiment of the present invention, which includes a capacitor, a TFT, and an organic light emitting diode connected to the TFT. Referring to FIGS. 3A to 3D, a TFT panel and an OLED of another exemplary embodiment of the present invention are similar to the TFT panel and the OLED of the exemplary embodiment of the present invention shown in FIGS. 2A to 2F, except that a first insulation layer pattern of an interlayer insulation layer partially remains in a TFT region.

Hereinafter, another exemplary embodiment of the present invention will be described with reference to the accompanying drawings.

Figure 3A:
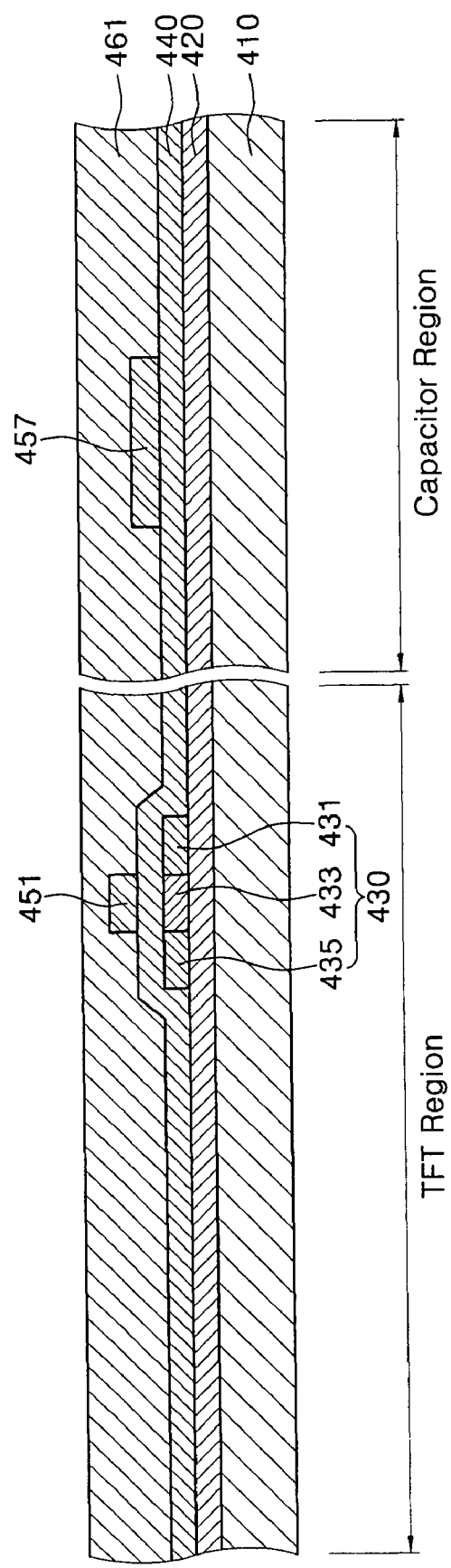
FIGS. 3A to 3D show cross-sectional views at processes of fabricating an OLED constructed as another exemplary embodiment of the present invention.

Referring to FIG. 3A, substrate 410 has a TFT region (or a transistor region) and a capacitor region on a surface of substrate 410. Buffer layer 420 is formed on substrate 410. Active layer 430 having source region 431 and drain region 435 is formed on substrate 410 in the TFT region. Gate insulation layer 440 is formed on substrate 410 covering buffer layer 420 and active layer 430. A predetermined conductive material is applied and patterned to form gate electrode 451 in the TFT region, and capacitor lower electrode 457 is formed in gate insulation layer 440 in the capacitor region. A region 433, which is formed between the source and drain regions 431 and 435 of the active layer 430, works as a channel of the TFT.

After forming gate electrode 451 and capacitor lower electrode 457, first insulation layer 461, which is made of a high dielectric material, is formed on the entire surface of substrate 410. The high dielectric material may include tantalum pentoxide ($Ta_2O_5$), titanium dioxide ($TiO_2$), silicon nitride (SiNx), or aluminum oxide ($Al_2O_3$).

Figure 3B:
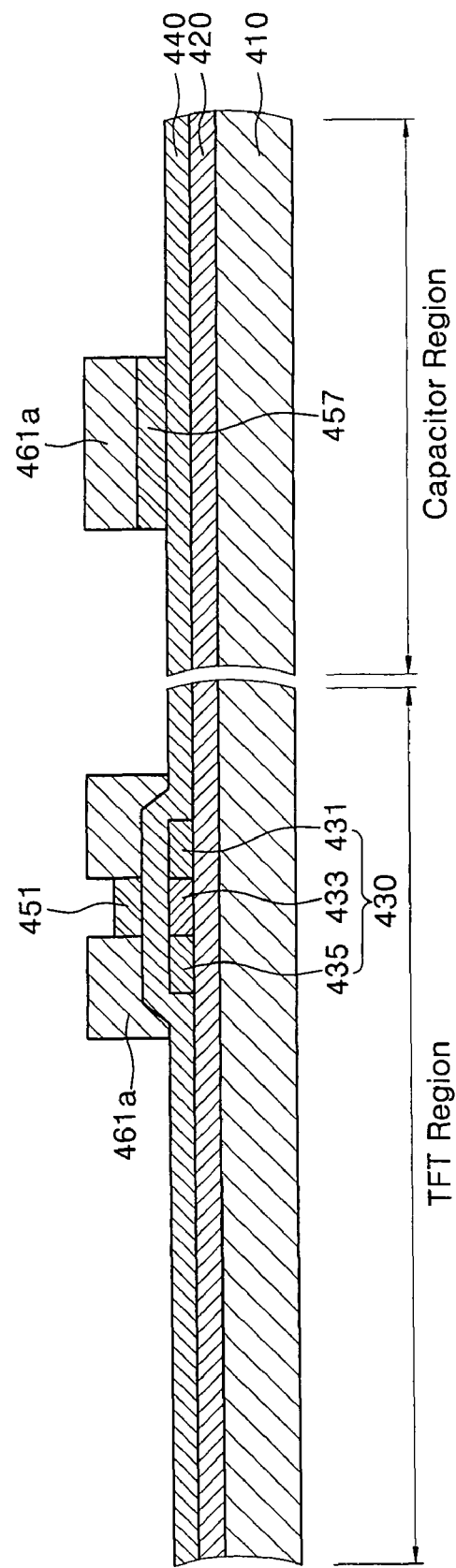

Referring to FIG. 3B, first insulation layer 461 is patterned to form first insulation layer pattern 461a on a portion of active layer 430 in the TFT region and on capacitor lower electrode 457. First insulation layer 461 is not formed on the top of gate electrode 451 that disposed on the top of active layer 430 in the TFT region. First insulation layer pattern 461a on a portion of active layer 430 can be referred to as a first TFT insulation layer pattern. Further, first insulation layer 461, which can be formed on a metal interconnection (not shown), may remain to form first insulation layer pattern 461a.

Figure 3C:
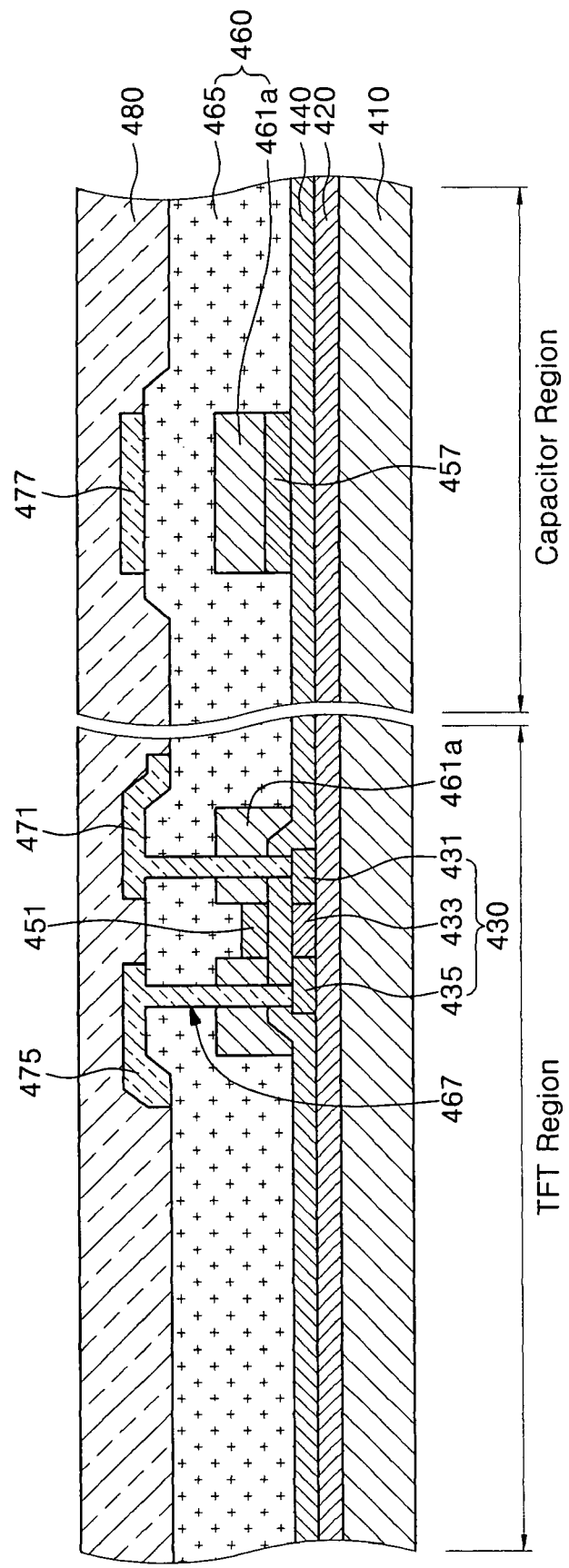

Referring to FIG. 3C, after forming first insulation layer pattern 461a, second insulation layer 465 is formed on the entire surface of substrate 410. Second insulation layer 465 together with first insulation layer pattern 461a forms interlayer insulation layer 460. Second insulation layer 465 may be made of a material such as silicon oxide ($SiO_2$), silicon nitride (SiNx), silicon oxynitride (SiON), or equivalents thereof, which is generally used for a insulation layer. Second insulation layer 465 may be formed of a material having a relatively capacitor lower dielectric constant in comparison with first insulation layer 461. Second insulation layer 465 formed in the TFT region can be referred to as a second TFT insulation layer.

After forming second insulation layer 465, contact hole 467 is formed though interlayer insulation layer 460. A portion of source and drain regions 431 and 435 of active layer 430 is exposed through contact hole 467. A predetermined conductive material is deposited and patterned to form source and drain electrodes 471 and 475, which are electrically connected to source and drain regions 431 and 435, respectively, through contact hole 467 in the TFT region. Capacitor upper electrode 477 is formed on the top of interlayer insulation layer 460 to form a capacitor in the capacitor region together with capacitor lower electrode 457 and interlayer insulation layer 460. Passivation layer 480 is formed on the entire surface of substrate 410.

Figure 3D:
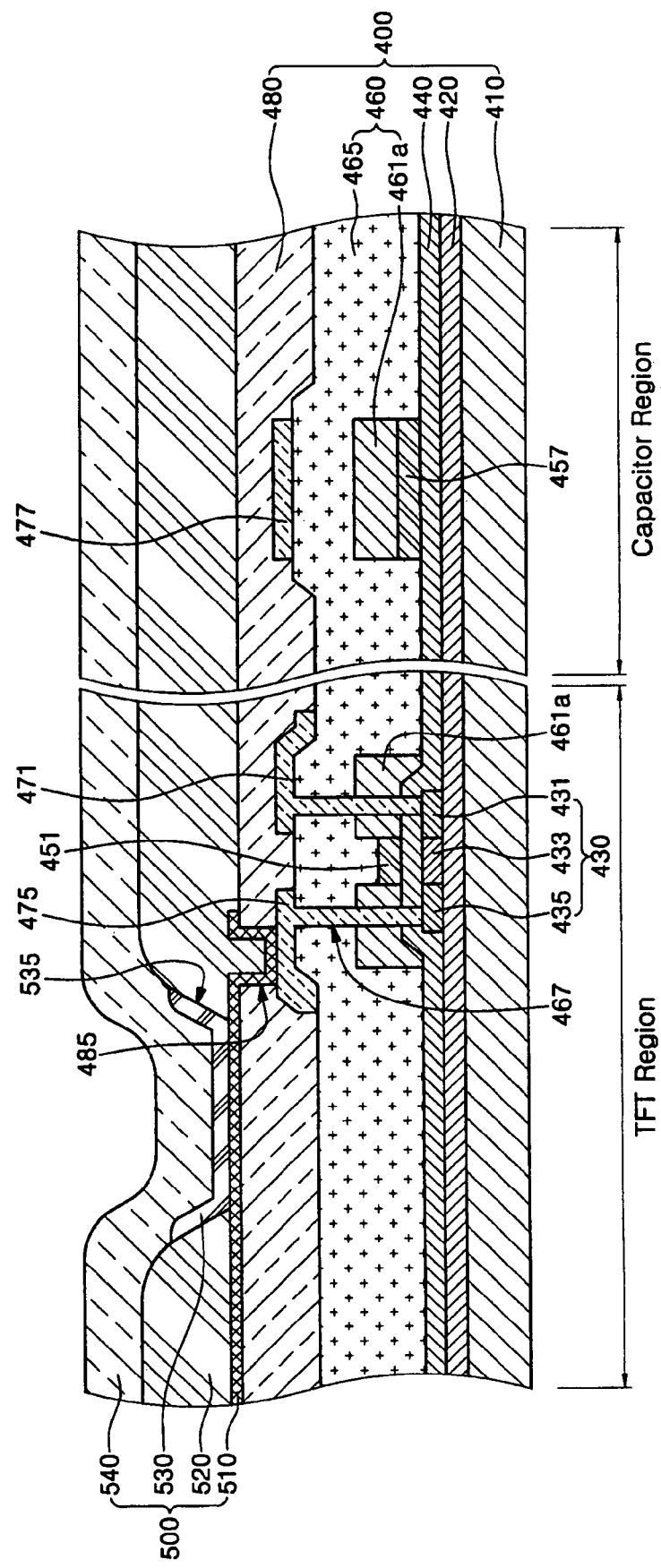

Referring to FIG. 3D, after TFT panel 400 is completed, passivation layer 480 is patterned to form via-hole 485 that exposes a portion of source electrode 471 or drain electrode 475. In this embodiment, drain electrode 475 is exposed through via-hole 485.

Organic light emitting diode 500 is formed on the top of passivation layer 480. Organic light emitting diode 500 includes first electrode 510, pixel defining layer 520, organic layer 530, and second electrode 540. The structure and function of organic light emitting diode 500 are substantially the same as the structure and function of organic light emitting diode 300 described referring to FIGS. 2A through 2F. Therefore the detailed description of organic light emitting diode 500 will be omitted.

After organic light emitting diode 500 is completed, processes, such as an encapsulation process and so on, are performed to complete an OLED that is constructed as another exemplary embodiment of the present invention.

As can be seen from the foregoing, it is possible to provide a TFT panel, which has interlayer insulation layers with different dielectric constants in a TFT region and a capacitor region, a method of fabricating the same, and an OLED including the same. In addition, it is possible to provide a TFT panel, a method of fabricating the same, and an OLED including the same, which is capable of increasing capacitance of a capacitor by employing an interlayer insulation layer having a high dielectric constant, while maintaining low capacitance of a TFT to reduce a parasitic capacitance of the TFT.

Although the present invention has been described with reference to certain exemplary embodiments thereof, it will be understood by those skilled in the art that a variety of modifications and variations may be made to the present invention without departing from the spirit or scope of the present invention defined in the appended claims, and their equivalents.

What is claimed is:

1. A thin film transistor panel comprising:
   a substrate having a TFT region and a capacitor region on a surface of the substrate;
   an active layer formed on the TFT region of the substrate, the active layer including a source region and a drain region;
   a gate insulation layer formed on the TFT region and on the capacitor region of the substrate;
   a gate electrode formed on the gate insulation layer over the active layer;
   a TFT interlayer insulation layer formed in the TFT region, the TFT interlayer insulation layer formed on the gate electrode and on the TFT region;
   a source electrode formed on the TFT interlayer insulation layer, the source electrode being connected to the source region;
   a drain electrode formed on the TFT interlayer insulation layer, the drain electrode being connected to the drain region;
   a capacitor lower electrode formed on the gate insulation layer of the capacitor region;
   a capacitor interlayer insulation layer formed on the capacitor lower electrode, the capacitor interlayer insulation layer including a first capacitor insulation layer pattern formed on the capacitor lower electrode, the first capacitor insulation layer pattern not being formed on the gate electrode; and
   a capacitor upper electrode formed on the capacitor interlayer insulation layer.

2. The thin film transistor panel according to claim 1, comprised of the capacitor interlayer insulation layer having a higher dielectric constant than the TFT interlayer insulation layer.

3. The thin film transistor panel according to claim 1, comprised of the capacitor interlayer insulation layer comprising:
   a second capacitor insulation layer formed on the first capacitor insulation layer pattern.

4. The thin film transistor panel according to claim 3, comprised of the TFT interlayer insulating layer comprising:
   a first TFT insulation layer pattern formed on a region of the gate insulation layer on which the gate electrode is not formed; and
   a second TFT insulation layer formed on the first TFT insulation layer and formed on the gate electrode.

5. The thin film transistor panel according to claim 4, comprised of the first TFT insulation layer pattern being made of the same material as the first capacitor insulation layer pattern, and comprised of the second TFT insulation layer being made of the same material as the second capacitor insulation layer.

6. The thin film transistor panel according to claim 3, comprised of the TFT interlayer insulating layer comprising:
   a first TFT insulation layer formed on the gate electrode and formed on the TFT region.

7. The thin film transistor panel according to claim 6, comprised of the first TFT insulation layer being made of the same material as the second capacitor insulation layer.

8. The thin film transistor panel according to claim 3, comprised of the first capacitor insulation layer pattern having a higher dielectric constant than the second capacitor insulation layer.

9. The thin film transistor panel according to claim 3, comprised of the first capacitor insulation layer pattern being made of a material selected from the group consisting of tantalum pentoxide ($Ta_2O_5$), titanium dioxide ($TiO_2$), silicon nitride (SiNx), and aluminum oxide ($Al_2O_3$).

10. The thin film transistor panel according to claim 3, comprised of the second capacitor insulation layer being made of a material selected from the group consisting of silicon oxide ($SiO_2$), silicon nitride (SiNx), and silicon oxynitride (SiON).

11. The thin film transistor panel according to claim 1, further comprising a passivation layer formed on the entire surface of the substrate having the source electrode, the drain electrode, and the capacitor upper electrode.

12. A method of fabricating a thin film transistor (TFT) panel, comprising:
   preparing a substrate having a TFT region and a capacitor region on a surface of the substrate;
   forming an active layer on the TFT region of the substrate, the active layer including a source region and a drain region;
   forming a gate insulating layer on the TFT region and on the capacitor region of the substrate;
   forming a gate electrode on the gate insulation layer over the active layer;
   forming a capacitor lower electrode on the gate insulation layer of the capacitor region;
   forming a capacitor interlayer insulation layer on the capacitor lower electrode, the capacitor interlayer insulation layer including a first insulation layer pattern formed on the electrode;
   forming a second insulation layer to cover the gate electrode, the TFT region and the first insulation layer pattern, the second insulation layer formed on the gate electrode and the TFT region being a TFT interlayer insulation layer;
   forming a source electrode on the TFT interlayer insulation layer formed in the TFT region, the source electrode being connected to the source region;
   forming a drain electrode on the TFT interlayer insulation layer in the TFT region, the drain electrode being connected to the drain region; and
   forming a capacitor upper electrode on the capacitor interlayer insulation layer formed in the capacitor region.

13. The method according to claim 12, comprised of the first insulation layer pattern having a higher dielectric constant than the second insulation layer.

14. An organic light emitting display device comprising:
   a substrate having a TFT region and a capacitor region on a surface of the substrate;
   an active layer formed on the TFT region of the substrate, the active layer including a source region and a drain region;
   a gate insulation layer formed on the active layer and formed on the capacitor region of the substrate;
   a gate electrode formed on the gate insulation layer over the active layer;
   a TFT interlayer insulation layer formed in the TFT region, the TFT interlayer insulation layer formed on the gate electrode and formed on the TFT region;
   a source electrode formed on the TFT interlayer insulation layer, the source electrode being connected to the source region;
   a drain electrode formed on the TFT interlayer insulation layer, the drain electrode being connected to the drain region;
   a capacitor lower electrode formed on the gate insulation layer of the capacitor region;
   a capacitor interlayer insulation layer formed on the capacitor lower electrode, the capacitor interlayer insulation layer including a first capacitor insulation layer pattern formed on the capacitor lower electrode, the first capacitor insulation layer pattern not being formed on the gate electrode;
   a capacitor upper electrode formed on the capacitor interlayer insulation layer;
   a passivation layer formed on the entire surface of the substrate having the source electrode, the drain electrode, and the capacitor upper electrode; and
   an organic light emitting diode having a first electrode, an organic layer, and a second electrode; the first electrode of the organic light emitting diode being connected to the source electrode or the drain electrode.

15. The organic light emitting display device according to claim 14, comprised of the capacitor interlayer insulation layer having a higher dielectric constant than the TFT interlayer insulation layer.

16. The organic light emitting display device according to claim 14, comprised of the capacitor interlayer insulation layer comprising:
   a second capacitor insulation layer formed on the first capacitor insulation layer pattern.

17. The organic light emitting display device according to claim 16, comprised of the TFT interlayer insulating layer comprising:
   a first TFT insulation layer pattern formed on a region of the gate insulation layer on which the gate electrode is not formed; and
   a second TFT insulation layer formed on the first capacitor insulation layer and formed on the gate electrode.

18. The organic light emitting display device according to claim 16, comprised of the first capacitor insulation layer having a higher dielectric constant than the second capacitor insulation layer.

19. The organic light emitting display device according to claim 17, comprised of the first insulation pattern being made of the same material as the first capacitor insulation layer pattern, and comprised of the second TFT layer being made of the same material as the second capacitor insulation layer.

20. The organic light emitting display device according to claim 16, comprised of the TFT interlayer insulating layer comprising:
   a first TFT insulation layer formed on the gate electrode and formed on the TFT region.

21. The organic light emitting display device according to claim 20, comprised of the first TFT insulation layer being made of the same material as the second capacitor insulation layer.

* * * * *